United States Patent
Kliewer et al.

(10) Patent No.: US 7,180,820 B2
(45) Date of Patent: Feb. 20, 2007

(54) INTEGRATED SEMICONDUCTOR MEMORY COMPRISING AT LEAST ONE WORD LINE AND COMPRISING A MULTIPLICITY OF MEMORY CELLS

(75) Inventors: Jörg Kliewer, München (DE); Herbert Benzinger, München (DE); Manfred Pröll, Dorfen (DE); Stephan Schröder, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/140,554

(22) Filed: May 27, 2005

(65) Prior Publication Data

US 2005/0281118 A1 Dec. 22, 2005

(30) Foreign Application Priority Data

May 28, 2004 (DE) .................. 10 2004 026 128

(51) Int. Cl.
*G11C 8/00* (2006.01)
(52) U.S. Cl. ............................. 365/230.06; 365/230.03
(58) Field of Classification Search ........... 365/230.06, 365/230.03
See application file for complete search history.

(56) References Cited

U.S. PATENT DOCUMENTS 5,981,335 A * 11/1999 Chi ............................ 438/253
6,414,898 B1 * 7/2002 Chien ..................... 365/230.06
6,845,025 B1 * 1/2005 Nataraj ......................... 365/49
2005/0082572 A1 * 4/2005 Miyazaki et al. ............ 257/202
2005/0237777 A1 * 10/2005 Hsieh et al. ................... 365/63
2006/0120176 A1 * 6/2006 Schneider et al. ...... 365/189.07

FOREIGN PATENT DOCUMENTS

DE 101 03 526 A1 8/2002
EP 0 626 645 A2 11/1994

* cited by examiner

*Primary Examiner*—Michael T. Tran
(74) *Attorney, Agent, or Firm*—Slater & Matsil, L.L.P.

(57) ABSTRACT

An integrated semiconductor memory includes at least one word line and a number of memory cells. Each memory cell has a selection transistor coupled to the word line. A word line driver is coupled to the word line. The word line driver provides a first electrical potential or a second electrical potential to the word line such that the word line is activated by the first electrical potential and is deactivated by the second electrical potential. A passive component (e.g., a diode or a resistor) is coupled between the word line and the second electrical potential such that the word line is coupled to the second electrical potential in a high-resistance fashion through the passive component. The passive component is transmissive for a leakage current between the word line and the contact connection.

23 Claims, 7 Drawing Sheets

INTEGRATED SEMICONDUCTOR MEMORY COMPRISING AT LEAST ONE WORD LINE AND COMPRISING A MULTIPLICITY OF MEMORY CELLS

This application claims priority to German Patent Application 10 2004 026 128.8, which was filed May 28, 2004, and is incorporated herein by reference.

TECHNICAL FIELD

The invention relates to an integrated semiconductor memory comprising at least one word line and comprising a multiplicity of memory cells.

BACKGROUND

In integrated semiconductor memories, digital information items are stored in a multiplicity of memory cells that are in each case connected to a bit line and to a word line. Volatile semiconductor memories, in particular DRAMs (dynamic random access memory), possess memory cells that in each case have a selection transistor and a storage capacitor. The storage capacitor may be designed as a trench capacitor or as a stacked capacitor. One electrode of the storage capacitor can be electrically connected to a bit line by the selection transistor. By means of the bit line, a digital information item can be written to the storage capacitor or be read out from the latter. The transistor is electrically controlled by a word line. The transistor is often designed as a MOSFET (metal oxide semiconductor field effect transistor). Such a field effect transistor possesses a gate electrode, which simultaneously forms a section of the word line. The gate electrode is isolated from a channel region of the transistor by a dielectric layer, namely a gate oxide. A multiplicity of selection transistors are connected to each word line.

In present-day semiconductor memories, word lines usually have a master word line and a multiplicity of conductor segments connected to the master word line. The conductor segments are usually composed of polysilicon and form the gate electrodes of the selection transistors connected to the respective conductor segment. The same number of selection transistors is connected to each conductor segment of a word line. All the conductor segments of a word line are connected to the master word line. The master word line is usually composed of a metal and has a greater electrical conductivity than the conductor segments made of polysilicon. The metallic master word line serves for rapidly transmitting the control potentials for the word line to all the selection transistors connected to the word line. The control potentials for the word line are provided by at least one word line driver to which the word line is connected. The word line driver optionally provides a first or a second electrical potential for the word line. The word line is activated by the first electrical potential, as a result of which the selection transistors connected to the word line are opened. The word line is deactivated by the second electrical potential. The selection transistors connected to the word line are then closed.

Problems arise in integrated semiconductor memories if the electrical connection between a word line driver and the associated word line is interrupted on account of production-dictated faults. Causes of such electrical defects may be clipped, i.e., interrupted conductor connections in the metal plane in which the master word line is formed. A defect may equally be present in the polysilicon plane in which the conductor segments are produced. Furthermore, the connection between a master word line and a conductor segment may be interrupted, for example, due to a defective contact hole filling not effecting conductive connection. Particularly in the case of defective contact hole fillings, the cause is often due to the lithographic patterning of the contact holes. Thus, during the production of etching masks, lateral positional errors occur, which make it more difficult to effect a reliable electrically conductive connection of conductive structures deposited one on top of the other.

Therefore, before an integrated semiconductor memory is put into operation, an electrical functional test is carried out, during which selected memory addresses are written in and read out again in order to test proper operation of the memory. If a word line or a specific conductor segment of a word line is not conductively connected to a word line driver on account of a production fault, then the word line potential cannot be influenced in a targeted manner. The gate electrodes of the connected selection transistors then do not have a defined electrical potential, but rather are "floating," that is to say that their electrical potential is determined by parasitic leakage currents in their surroundings and fluctuates unpredictably. The connected selection transistors cannot be opened or closed in a targeted manner, so that defective memory addresses and thus defective word lines or word line segments are easily identified during the electrical functional test.

In present-day semiconductor memories, defective word lines can be replaced by redundant word lines. In this case, the defective word line is electrically isolated from its word line driver with the aid of electrical fusible links. With the aid of so-called fuses and antifuses, redundant word lines can be driven as a replacement instead of the defective word lines.

However, the electrical effects of the disconnected floating word line continue to pose problems. Since the word line is no longer electrically connected to the word line driver, it can no longer be switched to the second electrical potential that would deactivate it. Consequently, selection transistors can be opened on account of parasitic leakage currents in the vicinity of the word line. As a result, the electrical charge stored in the associated storage capacitor flows onto a bit line and alters the bit line potential thereof. If this takes place at a point in time at which another memory cell connected to the same bit line is being read, a read-out error arises. This read-out error arises even when the word line that drives the memory cell being read is intact. Consequently, even after the repair of a defective word line, i.e., after the latter has been replaced by a redundant word line, errors can still occur during the electrical functional test.

In present-day semiconductor memories, the risk of floating disconnected word lines is also increased by the fact that active drivers are provided at a plurality of locations on a word line. Thus, each conductor segment connected to a master word line is biased directly with the first or second electrical potential by an active driver that connects the conductor segment to the master word line. In an active driver, the connected conductor segment can optionally be biased with the first, activating electrical potential via a p-channel transistor or with the second, deactivating potential via an n-channel transistor, or vice versa. Once a conductor segment has been activated, it is deactivated again when the memory information has been read out. For this purpose, it is connected to the deactivating second electrical potential by the corresponding transistor of the active driver. However, if the transistor is defective, for example on account of a defective electrical contact, then the driver exclusively effects an activation of the conductor segment. Since the conductor segment can no longer be deactivated, after the first potential has been switched off, the floating potential of the conductor segment is still higher than in the case of a semiconductor memory without an active word line driver at the conductor segment. The probability of read-out errors is additionally increased as a result.

German Patent Application 101 03 526 A1, which is incorporated herein by reference, discloses a semiconductor memory whose word line segments are locally activated and deactivated by transistors serving as electrical switches. However, the transistors used as switches do not prevent floating of word line segments whose driver-side end is electrically decoupled on account of a defect.

SUMMARY OF THE INVENTION

In one aspect, the present invention provides a semiconductor memory that is less susceptible to read-out errors caused by defect word lines. In particular, the intention is to provide an integrated semiconductor memory whose word lines are reliably deactivated even when they are no longer electrically connected to the word line driver or to the deactivating word line potential that is to be provided by the word line driver or else to the master word line. The intention, then, is for read-out errors that arise as a result of capacitive couplings of floating word lines in integrated semiconductor circuits to be avoided more reliably than heretofore.

In one embodiment, the invention discloses an integrated semiconductor memory that includes at least one word line and a multiplicity of memory cells. The memory cells in each case have a selection transistor coupled to the at least one word line. A word line driver is provided, which optionally provides a first electrical potential or a second electrical potential for the word line. The word line is activated by the first electrical potential and is deactivated by the second electrical potential, and is coupled to a contact connection, which is biased with the second electrical potential, in high-resistance fashion by a passive component. The passive component is transmissive for a leakage current between the word line and the contact connection.

According to embodiments of the invention, the word line is coupled to a contact connection, which is electrically biased with the second electrical potential, in high-resistance fashion by a passive component. The passive component is transmissive for a leakage current between the word line and the contact connection. The passive component thus constitutes an additional electrical connection of the word line. Consequently, in the intact state, each word line has at least one low-resistance driver connection and also at least one high-resistance connection to the second electrical potential. The contact between the word line and the additional contact connection is at such high resistance that in the case of an intact driver connection, the word line potential corresponds to the potential provided by the driver. When the word line is activated, a small leakage current then flows through the passive component on account of the potential difference between the potential of the word line and the second potential present at the additional contact connection. As a result, the capacitance of the word line is only slightly increased. In the case of a defective driver connection, the passive component has the effect that the initially floating word line is discharged until the word line potential corresponds to the second electrical potential present at the contact connection. As a result, the initially floating word line is deactivated. Consequently, read-out errors can no longer arise if the word line is decoupled from the word line driver. The passive component is designed such that the leakage current between the word line and the additional contact connection is greater than parasitic leakage currents in the vicinity of the word line. Consequently, the additional contact connection determines the electrical potential of the defective, decoupled word line as soon as the latter is no longer actively driven up by the driver. This averts in particular the additionally increased risk of read-out errors in the case of semiconductor memories equipped with active word line drivers.

One embodiment provides for the passive component to be a semiconductor diode connected up in such a way that it is operated in the reverse direction. If the potential of an activated word line is for example greater than the deactivating potential at the additional contact connection, then the word line is connected to an n-doped layer and the contact connection is connected to a p-doped layer of the semiconductor diode. The operation of the semiconductor diode in the reverse direction may also include the case where no voltage is present at the semiconductor diode. However, a voltage that operates the semiconductor diode in the forward direction may not be present at the semiconductor diode.

As an alternative, it may be provided that the passive component is a Schottky diode. A Schottky diode arises at an interface between a metal and a semiconductor if a sufficiently high-resistance connection is produced by means of a suitable doping of the metal and/or of the semiconductor.

As an alternative, it may furthermore be provided that the passive component is a nonreactive resistor.

It is preferably provided that the at least one word line has a master word line and a plurality of conductor segments connected to the master word line, selection transistors of a multiplicity of memory cells being connected to each conductor segment. In the case of these so-called segmented word lines, an active driver is provided at each connection location between a conductor segment and the master word line. The active driver optionally provides the first or the second electrical potential for the relevant conductor segment of the word line.

It is preferably provided that each conductor segment is connected to a respective contact connection, which is biased with the second electrical potential, in high-resistance fashion by a passive component, each passive component being transmissive for a leakage current between the respective conductor segment and the respective contact connection. Consequently, a multiplicity of additional contact connections and passive components are provided, the number of which corresponds to the number of conductor segments of all the word lines of the integrated semiconductor circuit. Therefore, any conductor segment that is not electrically connected to the master word line, to the word line driver or to the deactivating second potential within the word line driver can be individually deactivated as rapidly as possible, i.e., be brought to the second electrical potential. The selection transistors connected to the conductor segment can then no longer be opened by parasitic leakage currents and read-out results of other memory cells can no longer be corrupted.

It is preferably provided that the conductor segments in each case possess a first end and a second end opposite to the first end, and the conductor segments are conductively connected to a word line driver segment at the first end and to the respective passive component at the second end. Consequently, the conductor segments in each case extend between an active word line driver and a passive component.

The word line driver and the component are in each case arranged at mutually opposite ends of a conductor segment. This ensures that even in the case of defective connection of the first end, the conductor segment can be deactivated from its second end. Floating word line potentials are prevented particularly reliably as a result.

It is preferably provided that the semiconductor memory has a memory cell array arranged between a first word line driver segment and a second word line driver segment, and a plurality of word lines, which in each case have a master word line and a plurality of conductor segments, crossing the first word line driver segment, the memory cell array and the second word line driver segment parallel to one another. Every second word line preferably has a conductor segment connected to the first word line driver segment, and the remaining word lines of the plurality of word lines in each case having a conductor segment connected to the second word line driver segment.

On the basic area of a semiconductor substrate, the memory cells are arranged such that they are particularly densely packed in a plurality of memory cell arrays. A driver segment that actively drives conductor segments that cross the driver segment is often arranged between two memory cell arrays in each case. Often an individual driver segment drives only a conductor segment of every second word line, i.e., every next but one of the word lines running over the driver segment. The conductor segments—leading over the memory cell array—of the remaining word lines in between are actively driven by a further word line driver segment on the other side of the memory cell array.

It is preferably provided that a word line having a conductor segment connected to the second word line driver segment is arranged between, in each case, two word lines having a conductor segment connected to the first word line driver segment. In this case, it is possible to arrange the electrical connections between the conductor segments and the driver segments in a boundary zone between the cell array and the word line driver segment. At the same time, word lines that are closest adjacent to one another can be arranged at the smallest possible distance from one another. The connecting connections between the conductor segments and the driver segments, which connecting connections are usually widened relative to the word line width, do not, therefore, lead to basic substrate area being taken up unnecessarily. It is preferably provided that a contact connection biased with the second electrical potential is arranged between the memory cell array and the first word line driver segment. This contact connection serves for providing the deactivating potential for deactivating floating word lines.

It is preferably provided that the conductor segments connected to the second word line driver segment reach as far as the contact connection arranged between the memory cell array and the first word line driver segment and are in each case connected to the contact connection in high-resistance fashion by a passive component. Consequently, the contact connection, which is arranged beside the first word line driver segment, serves for the potential deactivation of those conductor segments that are driven by the second word line driver segment on the other side of the memory cell array. Consequently, the first and second ends of each of the conductor segments crossing the memory cell array are situated at opposite edges of the memory cell array.

It is preferably provided that the contact connection arranged between the memory cell array and the first word line driver segment is a doped well, which is surrounded by an outer, oppositely doped well and is electrically insulated from a semiconductor substrate by the outer well.

In particular, it is provided that the outer well is electrically biased with respect to the contact connection and with respect to the semiconductor substrate such that a pn junction operated in the reverse direction in each case arises at an interface between the outer well and the semiconductor substrate and at an interface between the outer well and the contact connection. In this way, it is possible to arrange the additional contact connection for a multiplicity of conductor segments in a space-saving manner on the basic substrate area. The contact connection is a well arranged between the memory cell array and a word line driver segment. Consequently, there is no need for any additional structures for forming the contact connections in the metallization planes. Through a single electrical connection to the doped well, the second, deactivating potential can be provided in relatively large-area fashion on the semiconductor substrate and be utilized for the potential deactivation of a multiplicity of conductor segments.

It is preferably provided that each conductor segment connected to the second word line driver segment is conductively connected at its second end to a contact hole filling having an interface that adjoins the doped well and at which a Schottky diode is formed. In this case, the metallic contact hole filling opens directly onto the doped well biased with the second electrical potential.

As an alternative, it may be provided that each conductor segment connected to the second word line driver segment is conductively connected at its second end to a metallic contact hole filling, which is conductively connected to an inner well arranged within the doped well, a pn junction being formed in each case between the doped well and the inner well, the pn junction being connected in such a way that it is operated in the reverse direction. The operation of the pn junction in the reverse direction may also include the case where no voltage is present at the pn junction. However, a voltage that operates the pn junction in the forward direction may not be present at the pn junction. Within the doped well biased with the deactivating potential, a smaller, oppositely doped well is introduced for each conductor segment to be connected in high-resistance fashion, and has lateral dimensions which, at least in the direction transversely with respect to the course of the word lines, amount at most to double to triple the width of the conductor segments. This avoids a short circuit between conductor segments that are next but one adjacent to one another. The doped well biased with the second electrical potential forms a common high-resistance contact connection for all the conductor segments connected thereto.

It is preferably provided that the metallic contact hole fillings and the conductor segments connected to the second word line driver segment are connected to one another by, in each case, a further contact hole filling adjoining the second end of the respective conductor segment and by a conductor adjoining the contact hole filling and the further contact hole filling. In this case, the electrical connection between, in each case, a second end of a conductor segment and the contact connection is led via the first metallization plane. As a result, the conductors within the metallization plane, which connect the conductor segments to the contact connection, may be made wider than the conductor segments themselves without the lateral distance between conductor segments that are closest adjacent to one another having to be increased at the expense of the basic substrate area.

Furthermore, it is preferably provided that a dielectric layer is arranged on the semiconductor substrate, and the metallic contact hole filling extends through an opening in the dielectric layer as far as the semiconductor substrate. The dielectric layer is a gate oxide layer, in particular, which is cut out in regions for the high-resistance connection of the conductor segments to an additional contact connection in the substrate.

Finally, it is provided that the master word lines contain a metallic material, and that the conductor segments contain polysilicon. The master word lines preferably contain aluminum or copper. The conductor segments preferably comprise doped polysilicon.

Furthermore, it is preferably provided that the selection transistors are field effect transistors, and the conductor segments form gate electrodes of the connected selection transistors.

Finally, it is provided that the semiconductor memory is a volatile random access memory.

BRIEF DESCRIPTION OF THE DRAWINGS

The invention is described below with reference to FIGS. 1 to 10, in which.

Figure 1:
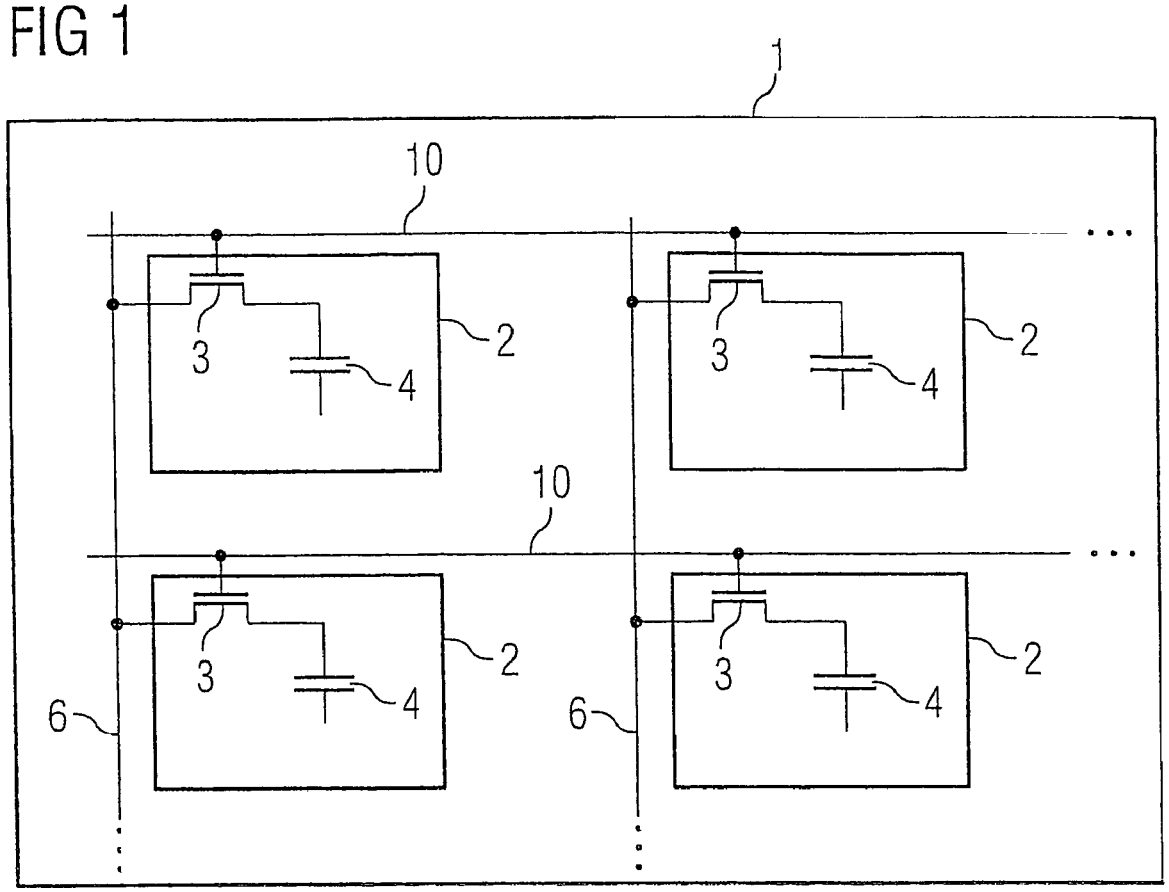
FIG. 1 shows a schematic plan view of a memory region of an integrated semiconductor memory.

The following list of reference symbols can be used in conjunction with the figures:
1 Semiconductor memory
2 Memory cell
3 Selection transistor
4 Storage capacitor
5 Passive component
6 Bit line
7 p-channel transistor
8 n-channel transistor
9 Word line
10a Redundant word line
11 Master word line
12, 12a, 12b Conductor segment
13 First end
14 Second end
15 Contact connection
15a Doped well
16 Outer well
16a, 16b Interface
17 Inner well
19 Word line driver
20, 20a, 20b Word line driver segment
21, 25, 31 Contact hole filling
22 Memory cell array
22a Redundant memory cell array
24 Dielectric layer
26 Further contact hole filling
27, 32 Interconnect
28 Schottky diode
30 Semiconductor substrate
33 Row decoder
34 Comparison unit
35 Address bus
36 AND gate
A, B Sectional plane
i Leakage current
n, p Doping
$V_0$ Ground potential
Vbb Substrate potential
Vpp First potential
Vnwll Second potential

DETAILED DESCRIPTION OF ILLUSTRATIVE EMBODIMENTS

FIG. 1 shows a schematic plan view of a memory region of an integrated semiconductor memory 1. The semiconductor memory 1 has a multiplicity of memory cells 2 coupled to word lines 10 and to bit lines 6. Each memory cell 2 preferably has a selection transistor 3 and a storage capacitor 4. The storage capacitor may be a trench capacitor or a stacked capacitor. The selection transistor is preferably a MOSFET, the gate electrode of which is formed by the word line 10 to which the selection transistor is connected.

Figure 2:
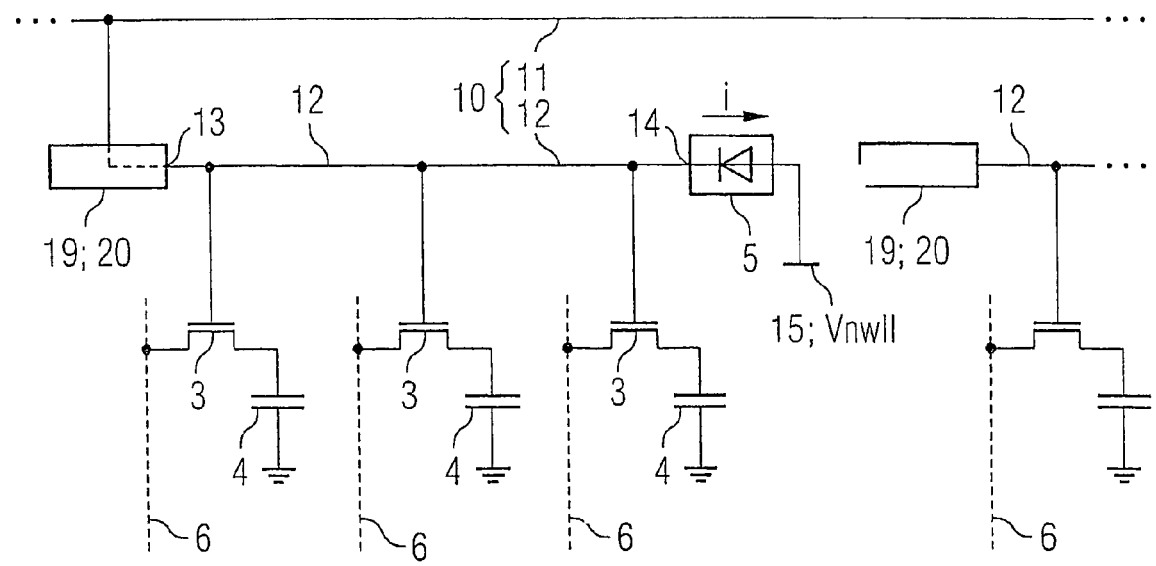
FIG. 2 shows a schematic illustration of a segmented word line of a semiconductor memory according to the invention.

FIG. 2 shows a schematic illustration of a segmented word line of a semiconductor memory according to the invention. The segmented word line 10 has a master word line 11 and a multiplicity of conductor segments 12, which are electrically connected to the master word line. The electrical connection between the master word line and the conductor segment may be produced by means of a conductive contact hole filling (stitch) or by means of an active word line driver segment 20. The conductor segment 12 is preferably connected to an active word line driver segment 20.

A multiplicity of selection transistors 3 are connected to each conductor segment 12. Each selection transistor 3 is connected to a storage capacitor 4 of the respective memory cell. Each selection transistor has two source/drain zones, of which one is connected to an electrode of the storage capacitor 4 and another is connected to a bit line 6.

According to the invention, a passive component 5 is provided, which couples the word line 10 to an additional contact connection 15 in high-resistance fashion, the contact connection is biased with the second, deactivating electrical potential Vnwll. The passive component is transmissive for leakage currents i between the word line 10 and the contact connection 15. The passive component 5 is at such high resistance that when the conductor segment 12, in the intact state, is conductively connected to the word line driver segment 20, the potential of the conductor segment 12 is determined by the word line driver segment 20. However, if the electrical connection between the conductor segment 12 and the word line driver segment 20 is interrupted, the leakage current i flowing through the passive component 5 leads to a discharge and thus to a deactivation of the conductor segment 12 until the electrical potential thereof corresponds to the potential Vnwll.

Preferably, the conductor segment 12 is connected to the word line driver segment 20 at a first end and 13 is connected to the contact connection 15 in high-resistance fashion by the component at a second, opposite end 14. The word line driver segment 20 is preferably connected to a conductor segment 12 and the master word line 11. FIG. 2 represents only a small section of a segmented word line. A real word line has a multiplicity of word line segments 12 which are in each case connected to a multiplicity of memory cells in the same way as the word line segment 12 illustrated completely in FIG. 2. Preferably, each conductor segment of any arbitrary word line is conductively connected by a passive component 5 to a contact connection 15 biased with the deactivating electrical potential Vnwll.

Figure 3:
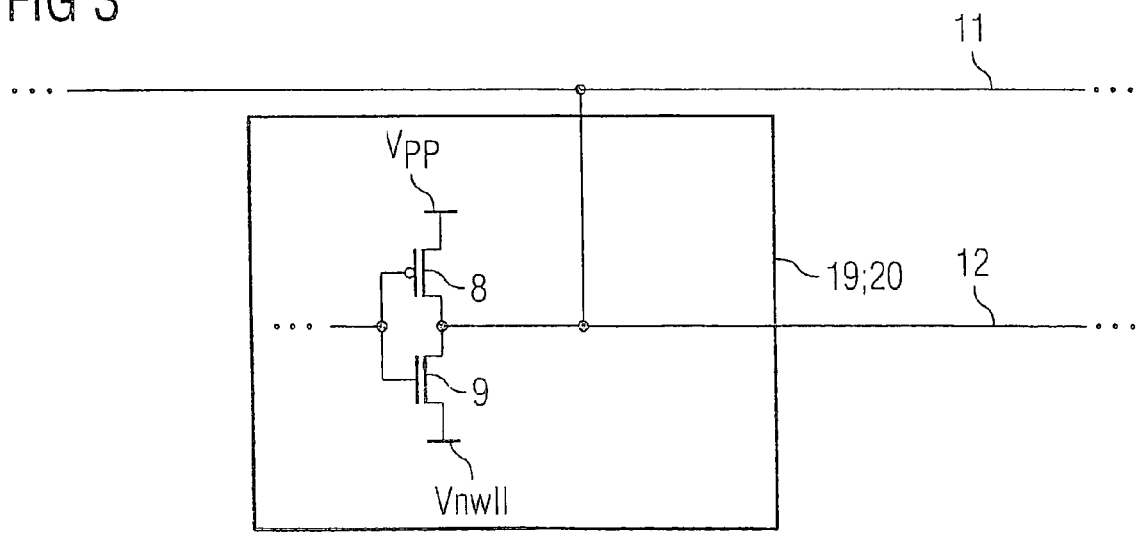
FIG. 3 shows an enlarged detail view from FIG. 2.

FIG. 3 shows an enlarged detail view from FIG. 2 illustrating part of the internal construction of the word line driver segment 20. Within the driver segment, the master word line 11 and the conductor segment 12 can be conductively connected to one another. The word line driver segment 20 has at least one n-channel transistor 9 and a p-channel transistor 8. One of the two transistors is coupled to the first potential Vpp for activating the word line segment 12. The other transistor is coupled to the second potential Vnwll for deactivating the conductor segment 12. By way of example, the p-channel transistor 8 may be coupled to the first potential Vpp. The gate electrodes of the two transistors have a common connection, by means of which one of the two transistors 8, 9 is turned on depending on the electrical potential present. As a result, either the first potential Vpp or the second potential Vnwll is provided for the conductor segment 12. The conductor segment 12 is electrically biased with the first or the second potential provided that the electrical connection between the conductor segment 12 and the word line driver segment 20 is not interrupted. This is because the potential of the conductor segment 12 is then floating on account of parasitic leakage currents that arise for example as a result of a capacitive coupling between the decoupled conductor segment 12 and adjacent word lines. If the conductor segment 12 can no longer be deactivated by the word line driver segment 20, parasitic leakage currents may open the selection transistors 3 (FIG. 2) connected to the decoupled conductor segment 12, as a result of which the quantities of charge stored in the corresponding storage capacitors 4 are distributed onto a bit line 6. If this takes place at a point in time at which another memory cell coupled to the same bit line is being read, then read-out errors arise. The latter are avoidable only if decoupled word lines are reliably deactivated. This is achieved according to embodiments of the invention by means of the additional contact connection 15 and by means of the passive component 5, as illustrated in FIG. 2. The high-resistance connection—arising at the second end 14 of the conductor segment 12—between the conductor segment 12 and the additional contact connection 15 according to embodiments of the invention leads to a discharging of the conductor segment 12 decoupled from the word line driver segment 20 and thus renders the conductor segment harmless. As a result, read-out errors on account of floating word lines can no longer occur.

Figure 4:
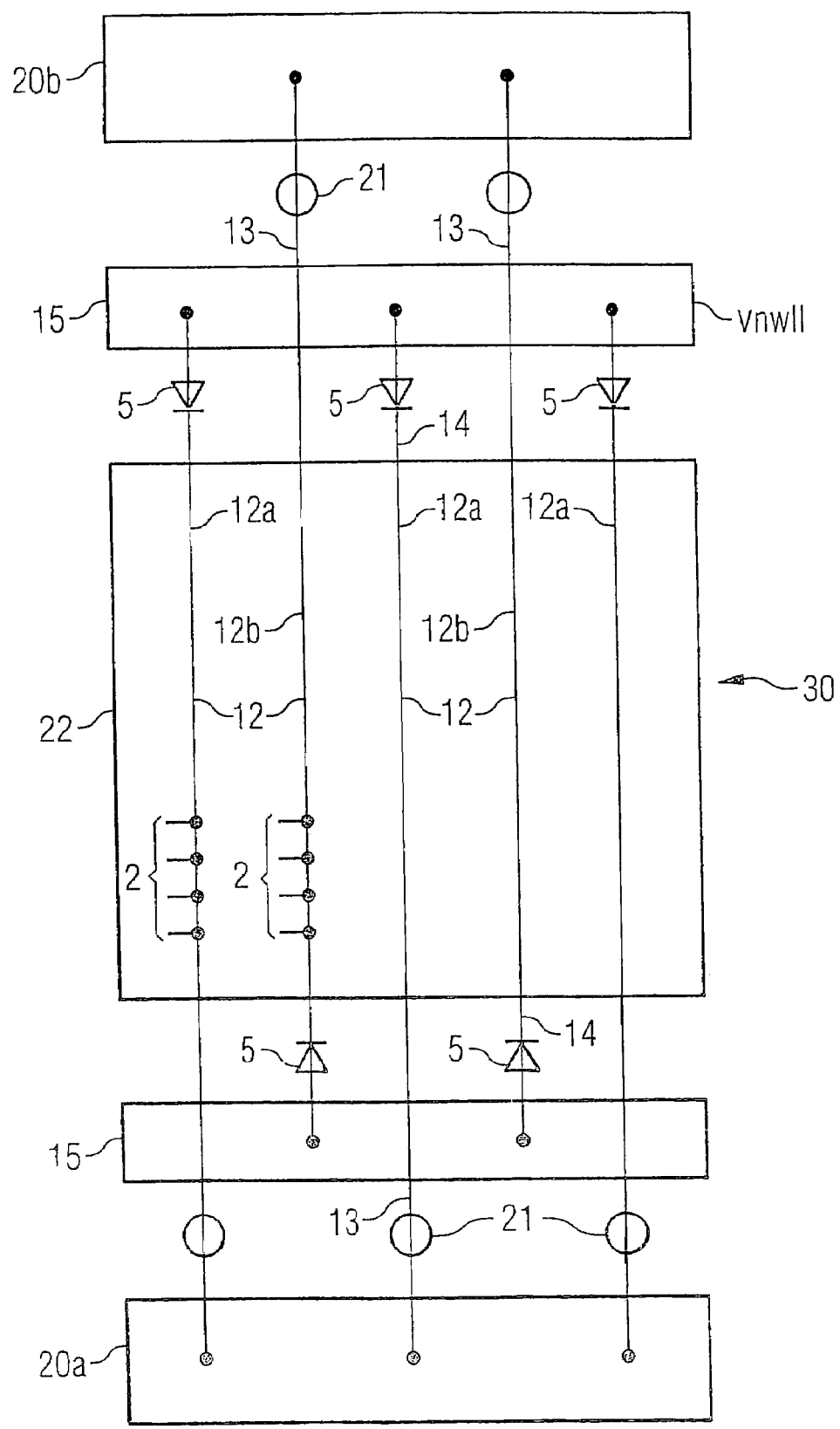
FIG. 4 shows a schematic plan view of a partial region of a semiconductor memory according to the invention with a memory cell array and two word line driver segments.

FIG. 4 shows a plan view of a partial region of a semiconductor memory according to embodiments of the invention. A first word line driver segment 20a, a second word line driver segment 20b and a memory cell array 22 in between are arranged on the surface of a semiconductor substrate 30. Word lines run over the memory cell array 22 and the word line driver segments 20a, 20b. FIG. 4 illustrates the word lines at the level of the conductor segments.

The conductor segments 12, which cross the memory cell array 22, are in each case coupled either to the first 20a or to the second word line driver segment 20b and extend as far as the respectively opposite edge of the memory cell array 22. Master word lines (not illustrated) run above the plane of the drawing and, in the lateral direction, reach beyond the word line driver segments 20a, 20b and cross further memory cell arrays and word line driver segments (not illustrated). The conductor segments 12 are connected to the master word line by means of contact hole fillings 21 at their respective first end 13. In the memory cell array a multiplicity of memory cells 2 are connected to each conductor segment 12. According to embodiments of the invention, each conductor segment 12 is connected at its second end 14 to a contact connection 15, which is electrically biased with the second, deactivating potential Vnwll, in high-resistance fashion by a passive component 5. In FIG. 4, the passive components 5 are illustrated as diodes. The conductor segments 12a connected to the first word line driver segment 20a extend as far as that contact connection 15, which is arranged between the memory cell array 22 and the second word line driver segment 20b. The conductor segments 12b connected to the second word line driver segment 20b extend as far as the contact connection 15 arranged between the first word line driver segment 20a and the memory cell array 22.

Figure 5:
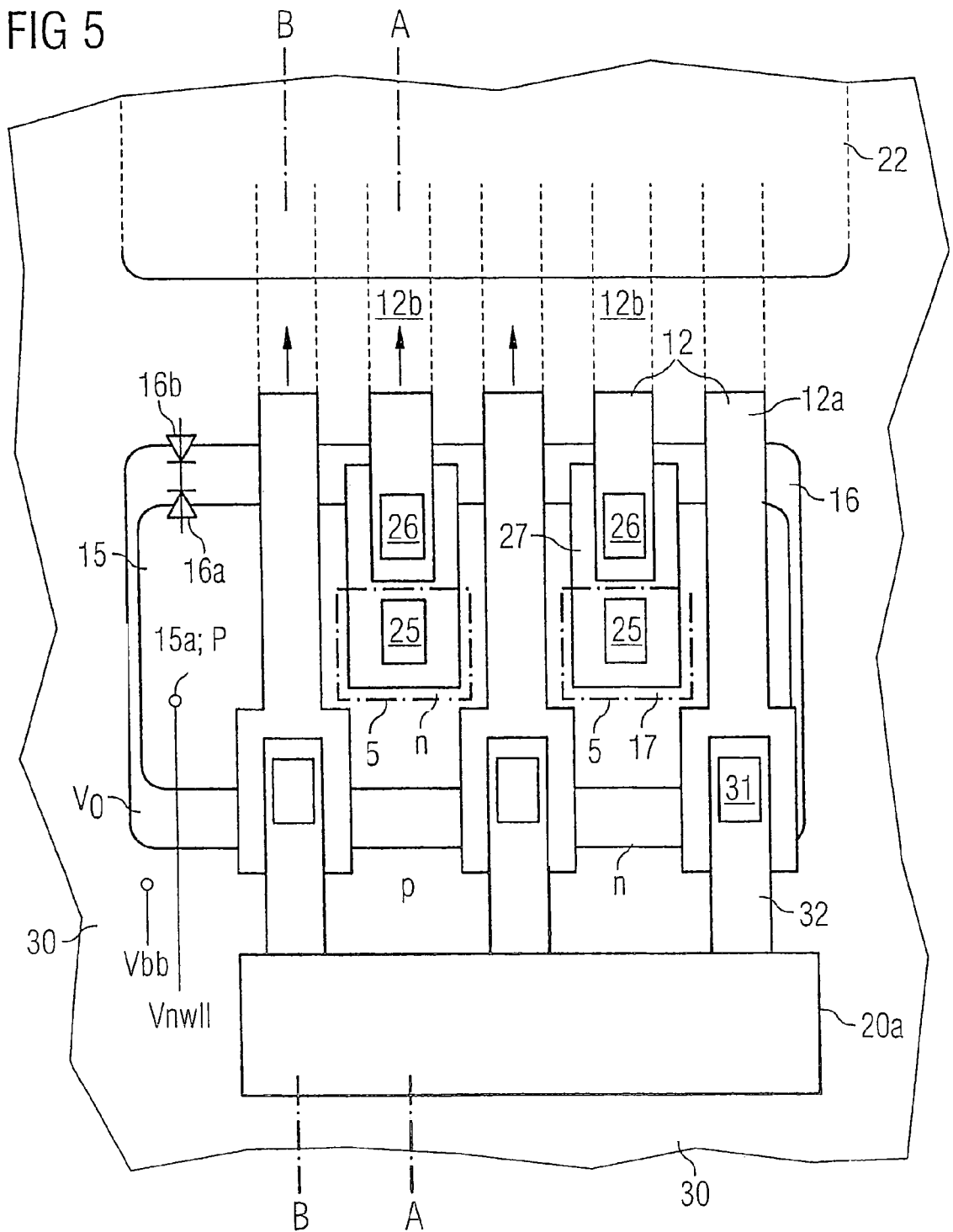
FIG. 5 shows a detailed illustration of the partial region from FIG. 4.

FIG. 5 shows an enlarged detail view of the contact connection 15 from FIG. 4 that is arranged between the memory cell array 22 and the first word line driver segment 20a. The contact connection 15 is formed as a doped well 15a arranged in the semiconductor substrate 30. The doped well 15a is isolated from a substrate potential Vbb by an outer well 16, which is doped oppositely to the doped well 15a and to the surrounding semiconductor substrate 30. The outer well 16 is electrically biased in such a way that a pn semiconductor diode operated in the reverse direction arises in each case at an interface 16a between the outer well 16 and the doped well 15a and also at an interface 16b between the outer well 16 and the semiconductor substrate 30.

By way of example, the semiconductor substrate 30 and the doped well 15a of the contact connection 15 are p-doped and the outer well 16 is n-doped. The second electrical potential Vnwll with which the doped well 15a is biased may be for example between −0.3 and −0.6 volts. The outer well 16 is biased for example with a ground potential $V_O$ of 0 volts. The substrate potential Vbb is for instance between −0.5 and 0 volts, for example −0.2 volts.

FIG. 5 illustrates five conductor segments 12, of which three conductor segments 12a are connected to the first word line driver segment 20a. For this purpose, the conductor segments 12a are connected by a contact hole filling 31 to a conductor 32 leading to the first word line driver segment 20a. In FIG. 5, two further conductor segments 12b are illustrated only in the region of their second end opposite to their first end 13 located at the second word line driver segment 20b (FIG. 4). In FIG. 5, all the word line segments 12 extend beyond the memory cell array 22 on both sides. The conductor segments 12b end in the region of the contact connection 15 and are conductively connected thereto via a contact hole filling 25, a conductor 27 and a further contact hole filling 26.

The conductor 27 serves for electrically connecting the two contact holes 25 and 26 to one another. Within the doped well 15a, an oppositely doped inner well 17 may additionally be provided under each contact hole 25. In this case, the passive component 5 between the respective conductor segment 12b and the contact connection 15 is a pn junction operated in the reverse direction between the doped well 15a and the respective inner well 17. The inner wells 17 are illustrated by broken lines since they are provided only in one embodiment. In accordance with an alternative embodiment, the contact hole filling 25 is directly connected to the doped well 15a, a Schottky diode being situated at an interface between them. No inner wells 17 are provided in this case.

Figure 6:
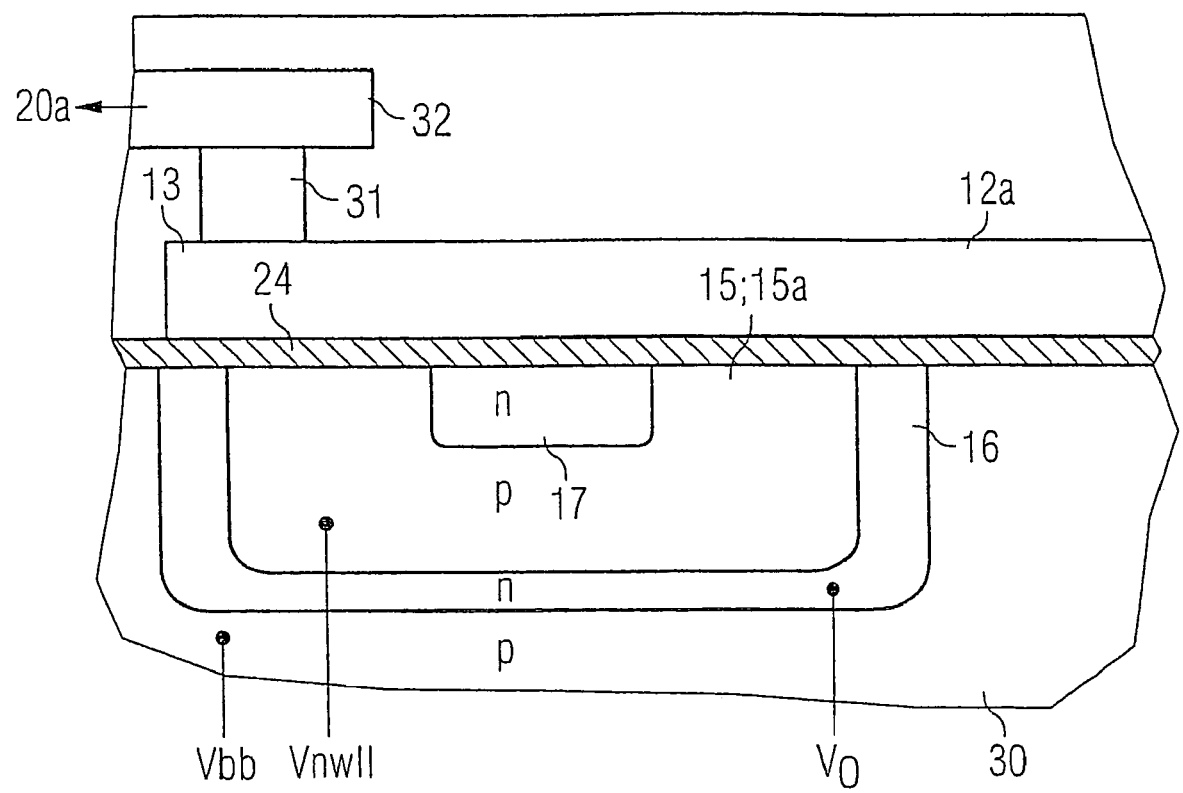
FIG. 6 shows a cross section through the semiconductor memory from FIG. 5 along the sectional plane B.

FIG. 6 shows a cross section through the semiconductor memory in accordance with FIG. 5 along the sectional plane B, that is to say along a conductor segment 12a connected to the first word line driver segment 20a. The conductive connection at the driver-side end 13 of the conductor segment 12a is produced by means of a contact hole filling 31 and a conductor 32 leading to the first word line driver segment 20a. The conductor segment 12a is arranged on a dielectric layer 24 and thereby electrically insulated from the semiconductor substrate 30. The doped well 15a—formed in the semiconductor substrate 30—of the contact connection 15, the surrounding outer well 16 and the optionally inner well 17 are illustrated in cross section in FIG. 6. The outer well 16 completely surrounds the doped well 15a of the contact connection and insulates it from the semiconductor substrate 30. Vbb designates the substrate potential and Vnwll designates the second potential, which deactivates the conductor segments and with which the contact connection 15 is biased. The outer well 16 is biased with the ground potential $V_0$ of 0 volts.

Figure 7:
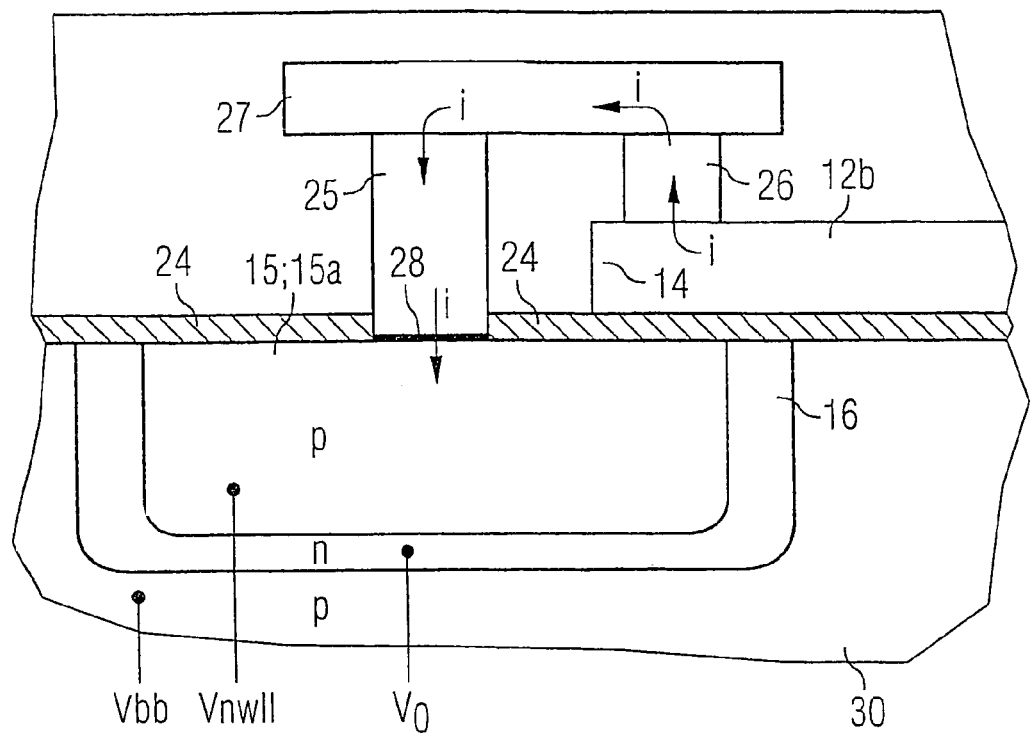
FIG. 7 shows a cross section through the semiconductor memory from FIG. 5 along the sectional plane A in accordance with a first embodiment.

FIG. 7 shows a cross section through a semiconductor memory according to embodiments of the invention in accordance with FIG. 5 along the sectional plane A in accordance with a first embodiment. In this embodiment, the high-resistance connection between a conductor segment 12b connected to the second word line driver segment 20b is produced by means of a Schottky diode 28 at an interface between a contact hole filling 25 and the doped well 15a of the contact connection 15. The Schottky diode is formed in the region of an opening of the dielectric layer 24. An inner well 17, as illustrated by broken lines in FIG. 5, is not present in this embodiment. The second end 14 of the conductor segment 12b is connected to the Schottky diode 28 by the contact hole filling 25, a further contact hole filling 26 and an interconnect 27 that connects the two contact hole fillings 25 and 26 to one another. The Schottky diode 28 is arranged in such a way that it is operated in the reverse direction and is transmissive for a leakage current i, i.e., a reverse current between the conductor segment 12b and the contact connection 15. The Schottky diode 28 forms a high-resistance connection for deactivating the conductor segment 12b if the latter is decoupled from the second word line driver segment 20b.

Figure 8:
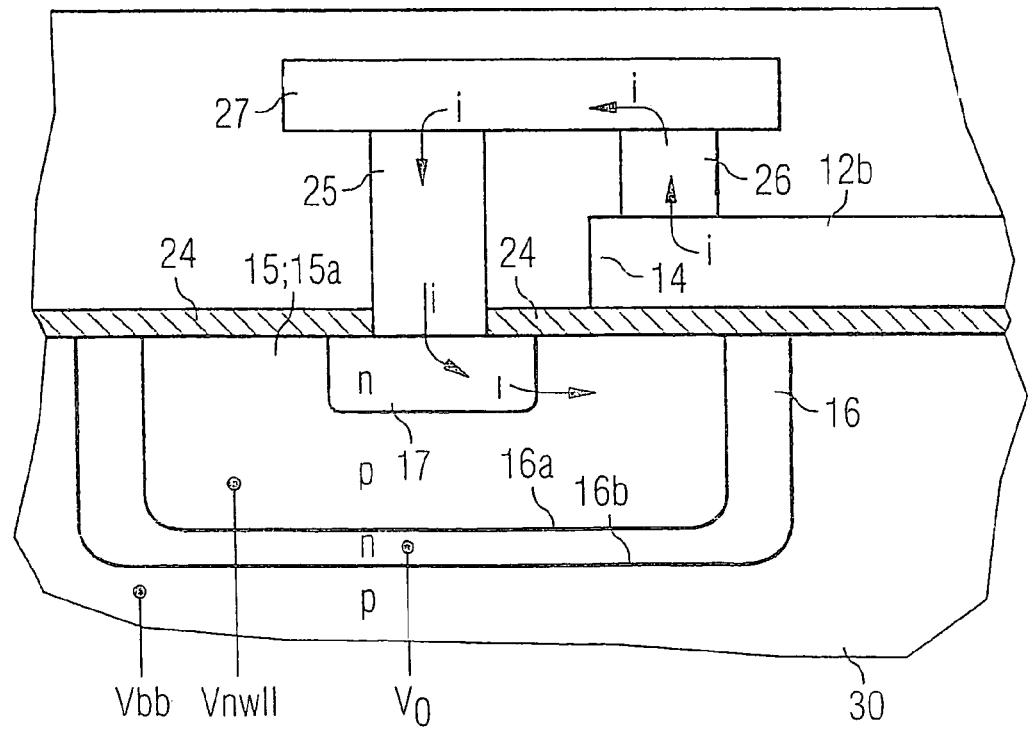
FIG. 8 shows a cross section through the semiconductor memory from FIG. 5 along the sectional plane A in accordance with a second embodiment.

FIG. 8 shows an alternative embodiment of a semiconductor memory according to embodiments of the invention. FIG. 8, in the same way as FIG. 7, illustrates a cross section through the semiconductor memory in accordance with FIG. 5 along the sectional plane A. In contrast to FIG. 7, however, an inner doped well 17 is incorporated into the doped well 15a of the contact connection 15. The interface between the contact hole filling 25 and the inner doped well 17 is not formed as a Schottky diode, but rather in low-resistance fashion. The inner well 17 is doped oppositely to the doped well 15a of the contact connection 15, for example n-doped. The second end 14 of the conductor segment 12 is connected to the contact connection 15 via the contact hole fillings 25 and 26, the interconnect 27 and also via the inner well 17. The leakage current i flows via this high-resistance connection. In this embodiment, the passive component is a pn semiconductor diode that is operated in the reverse direction and formed at the interface between the inner well 17 and the doped well 15a of the contact connection 15.

Figure 9:
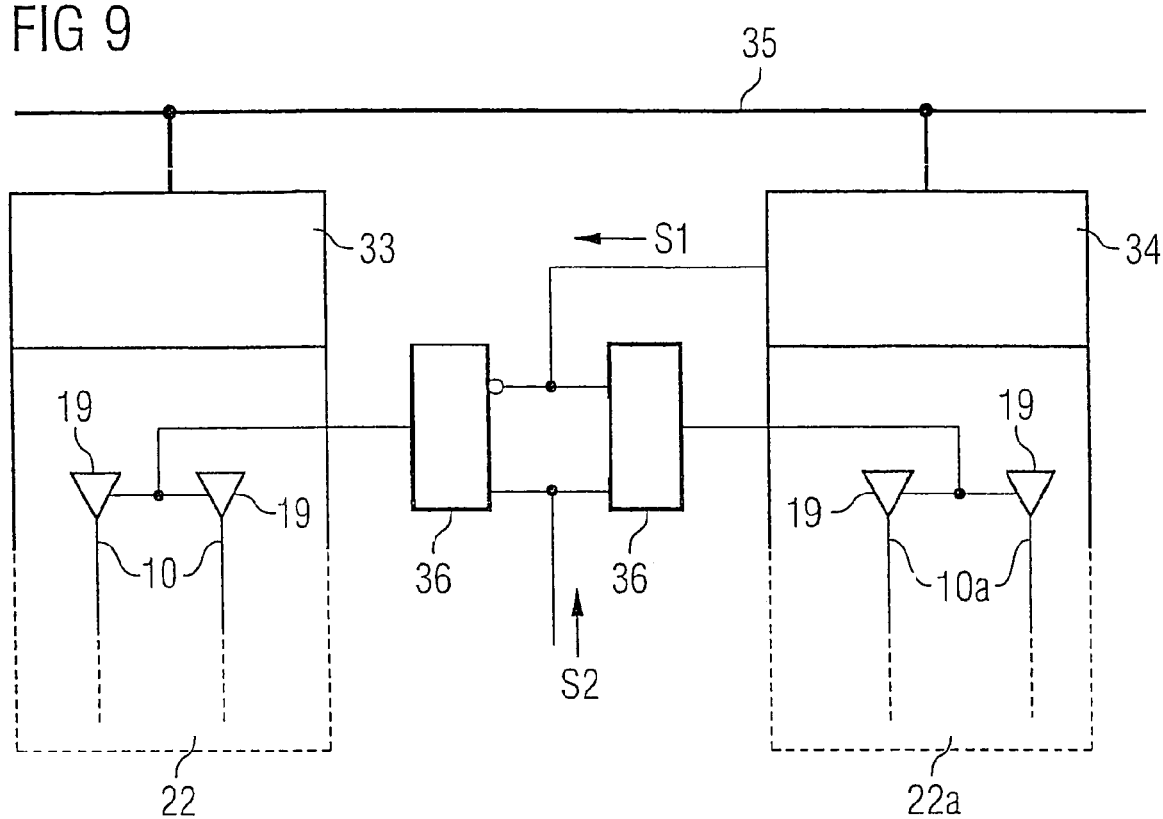
FIG. 9 shows a schematic plan view of a driver region of a semiconductor memory with redundant word lines.

FIG. 9 shows a schematic plan view of a driver region of a semiconductor memory with redundant word lines. The redundant word lines 10a are in each case segmented word lines of the same design as the segmented word lines 10 in the memory cell array 22. On an address line 35, which may comprise for example 13 interconnects, the x address, i.e., a word line address, is fed to a row decoder 33 and to a comparison unit 34. The comparison unit 34 compares the word line address communicated by the address bus 35 with a word line address that is permanently stored with the aid of electrical fusible links, i.e., fuses or antifuses, within the comparison unit 34.

If a word line address communicated by the address bus 35 matches the stored address, the comparison unit 34 emits a first signal S1, which is forwarded to two AND gates 36. An AND gate connected to the memory cell array 22 receives the signal S1 in inverting fashion. The signal S1 is emitted with a short delay by the comparison unit 34 after the latter has received the word line address communicated by the address bus 35. After a further delay, which takes account of the tolerances in the provision of the signal S1, a second signal S2 is passed without inversion to both AND gates 36. By virtue of the first signal S1 being forwarded in inverted fashion to only one of the two AND gates, it is only ever possible for one of these two AND gates 36 to be opened. The opened gate 36 then activates a group of word lines 10 or of redundant word lines 10a, which are in each case connected to word line drivers 19.

A group of four segmented word lines (corresponds to a master word line) is typically opened in each case. The first signal S1 is referred to as "redundancy hit signal" and the second signal S2 as "row address valid signal". If the word line address communicated by the address bus 35 matches the word line address stored in the fusible links in the comparison unit 34, a first signal S1 is emitted, which keeps the AND gate 36 connected to the memory cell array 22 closed and opens the other AND gate connected to the redundant memory cell array 22a. However, this gate is not opened until after the second signal S2 has been passed in time-delayed fashion with respect to the signal SI to the second input of the AND gate 36 connected to the redundant memory cell array 22a.

A master word line in the redundant memory cell array 22a is then opened instead of a master line in the normal memory cell array 22 and the master word line in the memory cell array 22 is no longer addressed. The redundant word lines 10a thus replace the defective word lines 10. The word lines 10 and the redundant word lines 10a are in each case complete word lines, for example segmented word lines, which in each case have a master word line and a multiplicity of conductor segments.

Figure 10:
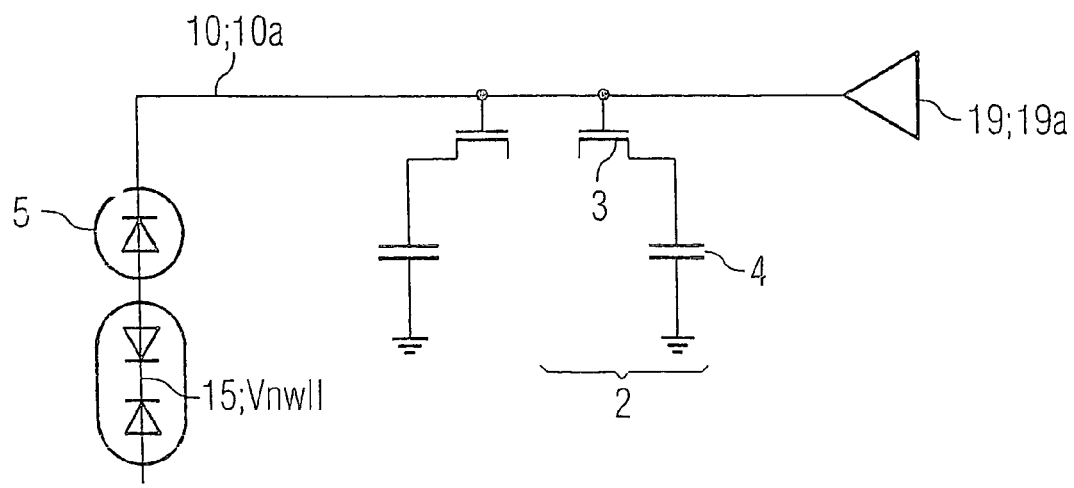
FIG. 10 shows an enlarged detail view with respect to FIG. 9.

FIG. 10 shows an enlarged detail view from FIG. 9, which schematically illustrates a word line and also a word line driver. The word line may be a regular word line 10 or a redundant word line 10a. The internal construction of the word line is not specified in detail. The word line may be a segmented word line, by way of example. In this case, it has a multiplicity of conductor segments connected to a master line, but they are not illustrated in FIG. 10. All the conductor segments of the segmented word line may be connected to a corresponding contact connection 15 in high-resistance fashion by a respective passive component 5, the contact connection being biased with the second potential Vnwll.

In FIG. 10, by contrast, only the segmented word line 10 altogether is illustrated schematically. Furthermore, only a single passive component 5 and a single contact connection 15 are illustrated. A multiplicity of memory cells 2 each having a selection transistor 3 and a storage capacitor 4 are connected to the word line 10. The word line driver 19 is activated with the aid of the comparison unit illustrated in FIG. 9 and an AND gate 36. If a defective word line has to be replaced, a redundant word line 10a is activated instead of the word line 10. The redundant word line is constructed in the same way as the replaced word line.

With the aid of the present invention, an integrated semiconductor memory is provided whose word lines in each case have a leakage current path. The leakage current path deactivates the word line if the latter is decoupled from a driver connection. Floating of word lines is avoided as a result. In particular, the word line potential cannot drift in the direction of the activating first electrical potential Vpp if, in the word line driver that provides the potential, a defect merely prevents the supply of the deactivating second potential Vnwll.

The leakage current path is a high-resistance connection between the word line and a contact connection biased with the deactivating potential. The contact connection is connected to the word line by a passive component, a so-called "bleeder". The bleeder is a discharge resistor or a discharge diode, which may be a semiconductor diode or a Schottky diode and is connected up in such a way that it is operated in the reverse direction. The passive component electrically couples the word line to the deactivating potential if the word line is decoupled on the driver side. As a result, leakage and coupling mechanisms of the surrounding cell array, in particular due to potentials present on adjacent word lines, can no longer determine the electrical potential of the decoupled word line. Consequently, the selection transistors connected to the decoupled word line remain closed. The quantities of charge stored in the associated storage capacitors can no longer flow onto the bit lines and can no longer cause read-out errors in the signal amplifiers. A reliable test coverage of the entire memory cell array without read-out errors is thereby made possible for the first time.

The invention can be used in particular for semiconductor memories comprising segmented word lines having metallic, low-resistance master word lines and in each case a multiplicity of conductor segments connected thereto. By way of example, between 256 and 512 memory cells are connected to each conductor segment, the memory cells being read by means of different bit lines in each case.

During a "prefuse" wafer test, i.e., an electrical functional test that is carried out temporally before a possible replacement of defective word lines by redundant word lines, read-out errors that might arise on account of defect-dictated decouplings of word lines or word line segments from the word line drivers cannot yet be ascertained because a defined electrical potential, namely Vpp or Vnwll, is still fed to all the word lines. It is only in the floating state when, after repair has been effected, an intentionally electrically decoupled word line can no longer be biased with a specific potential in a targeted manner that there is an increased risk of read-out errors.

In the case of word lines with conductor segments that are in each case driven actively by a word line driver segment, the conductor segments drift toward the activating potential if the driver can no longer provide the deactivating potential. This drift normally leads to an increased probability of read-out errors. By virtue of the leakage current paths according to embodiments of the invention at each conductor segment, however, the drift is avoided and a decoupled conductor segment is deactivated within a short time. As a result, the susceptibility to errors that is exhibited by integrated semiconductor memories and arises as a result of defective decoupled word lines is completely eliminated for the first time.

What is claimed is:

1. An integrated semiconductor memory comprising:
   at least one word line;
   a multiplicity of memory cells, each of the memory cells having a selection transistor coupled to the at least one word line, said at least one word line having a first end and a second end;
   a word line driver coupled to the first end of said at least one word line, the word line driver providing a first electrical potential or a second electrical potential to the word line such that the word line is activated by the first electrical potential and is deactivated by the second electrical potential; and
   a passive component coupled directly between the second end of said at least one word line and the second electrical potential such that the word line is coupled to the second electrical potential in a high-resistance fashion through the passive component, wherein the passive component is transmissive for a leakage current between the word line and the second electrical potential.

2. The semiconductor memory as claimed in claim 1, wherein the passive component comprises a semiconductor diode connected up in such a way that it is operated in the reverse direction.

3. The semiconductor memory as claimed in claim 1, wherein the passive component comprises a Schottky diode.

4. The semiconductor memory as claimed in claim 1, wherein the passive component comprises a nonreactive resistor.

5. The semiconductor memory as claimed in claim 1, wherein the at least one word line includes a master word line and a plurality of conductor segments coupled to the master word line, wherein each conductor segment is coupled to the selection transistors of some of the multiplicity of memory cells.

6. The semiconductor memory as claimed in claim 1, wherein the semiconductor memory comprises a volatile random access memory.

7. The semiconductor memory of claim 1 wherein each of said multiplicity of memory cells comprises a storage capacitor connected to said selection transistor.

8. An integrated semiconductor memory comprising:
   a word line that includes a master word line and a plurality of conductor segments coupled to the master word line;
   a multiplicity of memory cells, each of the memory cells having a selection transistor coupled to one of the plurality of conductor segments, each of the plurality of conductor segments having a first end and a second end;
   a word line driver coupled to said first end of the plurality of conductor segments of the word line, the word line driver providing a first electrical potential or a second electrical potential to the word line such that the word line is activated by the first electrical potential and is deactivated by the second electrical potential; and
   a plurality of passive components, each passive component coupled between a respective second end of one of the conductor segments and the second electrical potential such that each conductor segment is coupled to the second electrical potential in a high-resistance fashion through the passive component, wherein the passive component is transmissive for a leakage current between the word line and the second electrical potential.

9. The semiconductor memory as claimed in claim 8, wherein each conductor segment includes a first end and a second end opposite to the first end, wherein the word line driver comprises a plurality of word line driver segments, and wherein each conductor segment is conductively coupled to a respective one of the word line driver segments at the first end and to a respective one of the passive components at the second end.

10. The semiconductor memory as claimed in claim 8, wherein the master word line comprises a metallic material, and the conductor segments comprise polysilicon.

11. The semiconductor memory as claimed in claim 8, wherein the selection transistors comprise field effect transistors, and the conductor segments form gate electrodes of the selection transistors.

12. The semiconductor memory of claim 8 wherein each of said multiplicity of memory cells comprises a storage capacitor connected to said selection transistor.

13. An integrated semiconductor memory comprising:
a memory cell array including a multiplicity of memory cells arranged in rows and columns, each of the memory cells having a selection transistor;
a plurality word lines arranged along the rows of the memory cell array, each word line including a master word line and a plurality of conductor segments coupled to the master word line, each conductor segment includes a first end and a second end opposite to the first end;
a plurality of word line drivers, each word line driver including a plurality of word line driver segments, each word line driver segment coupled to the first end of a respective one of the conductor segments, each word line driver providing a first electrical potential or a second electrical potential to a respective one of the word lines such that the word line is activated by the first electrical potential and is deactivated by the second electrical potential; and
a plurality of passive components, each passive component coupled between a respective one of the conductor segments and the second electrical potential such that each conductor segment is coupled to the second electrical potential in a high-resistance fashion through the passive component.

14. The semiconductor memory as claimed in claim 13, wherein the word line driver segments include a first group of word line driver segments and a second group of word line driver segments, the first group being separated from the second group by a plurality of conductor segments; and
wherein every other word line has a conductor segment coupled to a word line driver segment from the first group, and the remaining word lines have a conductor segment coupled to a word line driver segment from the second group, such that a word line having an conductor segment coupled to a word line driver segment of the second group is arranged between two word lines having a conductor segment coupled to the word line driver segments of the first group.

15. The semiconductor memory as claimed in claim 14, wherein a contact connection biased with the second electrical potential is arranged between the plurality of conductor segments and the first group of word line driver segments.

16. The semiconductor memory as claimed in claim 15, wherein the conductor segments coupled to the word line driver segments of the second group are electrically coupled to the contact connection in high-resistance fashion by one of the passive components.

17. The semiconductor memory as claimed in claim 15, wherein the contact connection arranged between the plurality of conductor segments and the first word line driver segment comprises a doped well, which is surrounded by an outer, oppositely doped well and is electrically insulated from a semiconductor region by the outer well.

18. The semiconductor memory as claimed in claim 17, wherein the outer well is electrically biased with respect to the contact connection and with respect to the semiconductor region such that a pn junction operated in the reverse direction arises at an interface between the outer well and the semiconductor region and at an interface between the outer well and the contact connection.

19. The semiconductor memory as claimed in claim 17, wherein each conductor segment coupled to a word line driver segment of the second group is conductively coupled at its second end to a contact hole filling having an interface that adjoins the doped well and at which a Schottky diode is formed.

20. The semiconductor memory as claimed in claim 17, wherein each conductor segment coupled to a word line driver segment of the second group is conductively coupled at its second end to a metallic contact hole filling, which is conductively connected to an inner well arranged within the doped well, a pn junction operated in the reverse direction being formed between the doped welt and the inner well.

21. The semiconductor memory as claimed in claim 20, wherein the metallic contact hole fillings and the conductor segments coupled to the word line driver segments of the second group are coupled to one another by a further contact hole filling adjoining the second end of the respective conductor segment and by an interconnect adjoining the contact hole filling and the further contact hole filling.

22. The semiconductor memory as claimed in claim 20, wherein a dielectric layer is arranged on the semiconductor substrate, and the metallic contact bole filling extends through an opening in the dielectric layer as far as the semiconductor substrate.

23. The semiconductor memory of claim 13 wherein each of said multiplicity of memory cells comprises a storage capacitor connected to said selection transistor.

* * * * *